(12) United States Patent
Langhammer et al.

(10) Patent No.: US 9,787,290 B2
(45) Date of Patent: Oct. 10, 2017

(54) RESOURCE-SAVING CIRCUIT STRUCTURES FOR DEEPLY PIPELINED SYSTOLIC FINITE IMPULSE RESPONSE FILTERS

(71) Applicant: Altera Corporation, San Jose, CA (US)

(72) Inventors: Martin Langhammer, Salisbury (GB); Simon Peter Finn, High Wycombe (GB)

(73) Assignee: Altera Corporation, San Jose, CA (US)

( * ) Notice: Subject to any disclaimer, the term of this patent is extended or adjusted under 35 U.S.C. 154(b) by 223 days.

(21) Appl. No.: 14/717,449

(22) Filed: May 20, 2015

(65) Prior Publication Data
US 2016/0344373 A1    Nov. 24, 2016

(51) Int. Cl.
*H03H 17/06* (2006.01)
*G06F 7/544* (2006.01)

(52) U.S. Cl.
CPC .......... *H03H 17/06* (2013.01); *G06F 7/5443* (2013.01); *H03H 2220/04* (2013.01); *H03H 2220/06* (2013.01)

(58) Field of Classification Search
CPC ............... G06F 7/5543; H03H 17/06
See application file for complete search history.

(56) References Cited

U.S. PATENT DOCUMENTS

| | | | | |
|---|---|---|---|---|
| 4,982,355 A * | 1/1991 | Nishimura | ............... | G06F 7/762 708/626 |
| 5,491,653 A * | 2/1996 | Taborn | ................... | G06F 7/5016 708/625 |
| 6,539,048 B2 * | 3/2003 | Hakala | ................. | H04B 1/7093 375/143 |
| 8,458,243 B1 * | 6/2013 | Demirsoy | ............. | G06F 7/5443 708/490 |
| 9,509,283 B2 * | 11/2016 | Park | .................... | H03H 17/0657 |
| 2010/0228806 A1 * | 9/2010 | Streicher | ................. | G06F 17/10 708/203 |
| 2015/0301827 A1 * | 10/2015 | Sideris | ................ | G06F 9/30181 712/226 |
| 2015/0341032 A1 * | 11/2015 | Sadowski | ............ | H03K 23/588 326/93 |

\* cited by examiner

*Primary Examiner* — Chuong D Ngo

(57) ABSTRACT

Circuitry that accepts a data input and an enable input, and generates an output sum based on the data input includes an input stage circuit that includes an input register. The input register accepts the enable input. The circuitry further includes a systolic register operatively connected to the input stage circuit, and the systolic register is operated without any enable connection. The circuitry further includes a multiplier connected to the systolic register, which is configured to generate a product value. The circuitry further includes an output stage circuit that includes an adder that calculates the output sum based least in part on the product value.

22 Claims, 13 Drawing Sheets

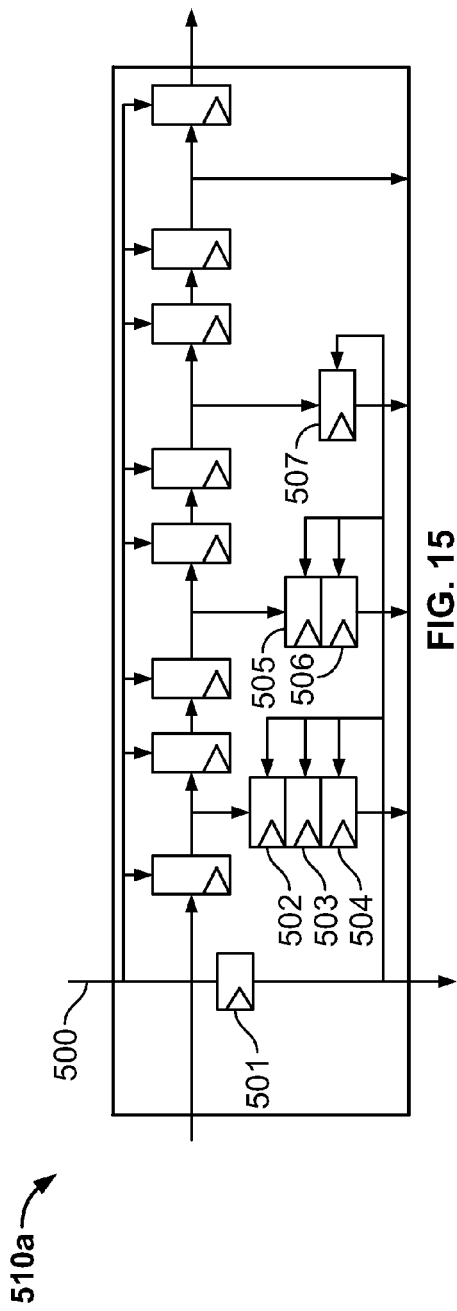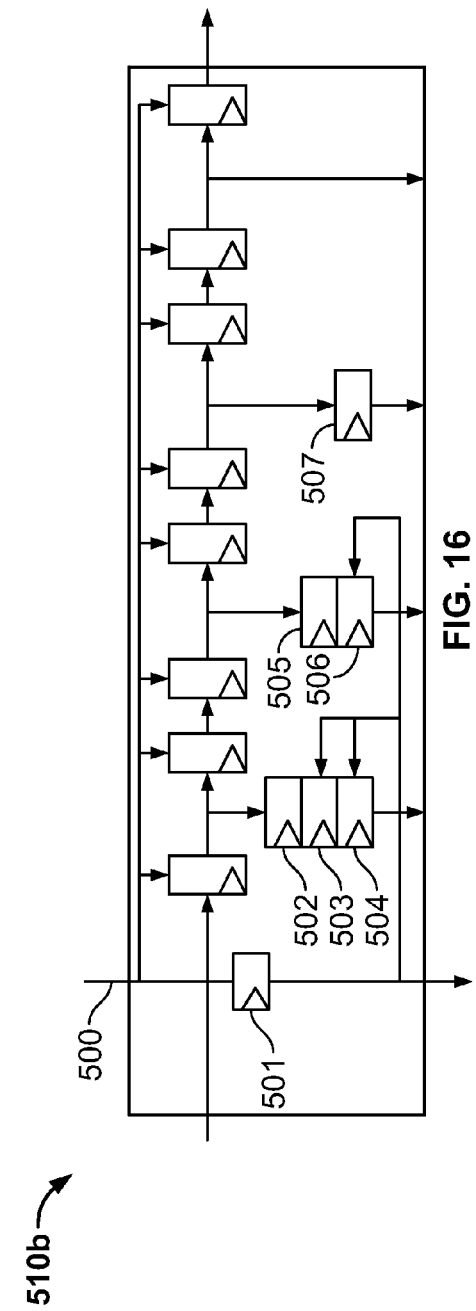

RESOURCE-SAVING CIRCUIT STRUCTURES FOR DEEPLY PIPELINED SYSTOLIC FINITE IMPULSE RESPONSE FILTERS

FIELD OF THE INVENTION

This invention relates to resource-saving circuitry that can be used to implement systolic finite impulse response (FIR) filters in deeply pipelined digital signal processing (DSP) circuits.

BACKGROUND OF THE INVENTION

Pipelining techniques can be used in a DSP system to enhance processing speed at a critical path of the circuit structure or to reduce power consumption at the same processing speed in the DSP system. By allowing different functional units to operate concurrently, DSP pipelining can increase the throughput of the DSP system when processing a stream of tasks.

One example application of a pipelined DSP system can be the implementation of FIR filters. As the FIR filter circuit usually involves a number of registers, an enabling signal or a clock signal is usually fed into each register to control the register operation. A flat enable arrangement can be used to have one enable signal directly connected to every register in the FIR filter. When the FIR filter is large or complex in scale, is implemented in a deeply pipelined DSP block, or is combined with other FIR filters as part of a larger system, the increased fan-out requirement associated with the flat enable arrangement affects performance of the circuit. For example, the high fan-out of the enable line usually requires additional resources such as additional power consumption to implement the high fan-out, as well as routing for the enable signal (which may consume additional general-purpose programmable logic resources when the FIR filter is implemented in a programmable integrated circuit such as a field-programmable gate array (FPGA) or other programmable logic device (PLD).

SUMMARY OF THE INVENTION

In accordance with embodiments of the present invention, a pipelined, or ripple enable arrangement is used to provide a separate enable signal at each pipeline state in a deeply pipelined systolic FIR filter circuit such that fan-out of an enable input is reduced. The ripple enable arrangement is further improved by reducing the number of enable connections, while maintaining flow control of the pipelined FIR filters without providing an enable signal connection to every register in the filter.

Therefore, in accordance with embodiments of the present invention there is provided a pipelined systolic FIR filter. The FIR filter includes an input stage circuit including an input register, a FIR calculation circuit including a systolic register and a multiplier, and an output stage circuit including an adder. The input register accepts an enable input. The FIR filter further includes a plurality of pipeline registers to pipeline part of an operation of the FIR calculation circuit or the adder. Each pipeline stage of the pipelined systolic FIR filter has a separate enable register without fanning out the enable input for each pipeline stage.

In accordance with embodiments of the present invention there is provided circuitry that accepts a data input and an enable input, and generates an output sum based on the data input. The circuitry includes an input stage circuit that includes an input register. The input register accepts the enable input. The circuitry further includes a systolic register operatively connected to the input stage circuit, and the systolic register is operated without any enable connection. The circuitry further includes a multiplier connected to the systolic register, which is configured to generate a product value. The circuitry further includes an output stage circuit that includes an adder that calculates the output sum based least in part on the product value.

In accordance with another embodiment of the present invention there is provided circuitry that accepts a data input and generates a finite impulse response output based on the data input. The circuitry includes an input stage circuit that includes an input register, a first multiplier operatively connected to the input stage circuit, a second multiplier operatively connected to the input stage circuit, and an output stage circuit operatively connected to the first multiplier and the second multiplier. The output stage circuit further includes a first adder, a second adder and a retiming register. The first adder is operatively connected to the first multiplier and the second multiplier. The second adder is directly connected to the first adder without any physical element separating the first adder and the second adder such that the first adder and the second adder can be physically merged. The retiming register placed between the first multiplier and the first adder to retime the output stage.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which:

FIGS. 15-16 show a series of example circuit diagrams illustrating grouping systolic registers in a systolic FIR block.

DETAILED DESCRIPTION OF THE INVENTION

The discussion that follows will be based on an example of a programmable integrated circuit device such as an field-programmable gate array (FPGA), or alternatively be based on an example of a customized circuit such as an application-specific integrated circuit (ASIC). However, it should be noted that the subject matter disclosed herein may be used in any kind of fixed or programmable device.

In some embodiments of the present invention, a structure for systolic FIR filters implemented in deeply pipelined DSP systems is introduced. The construction of the FIR filters includes a ripple enable arrangement, e.g., each pipeline stage has a separate enable signal without increasing enable fan-out. Such an enable arrangement can be implemented within a single DSP Block or between multiple DSP Blocks. In this way, the systolic FIR filters can be extended to have both an arbitrarily deep pipeline, and an arbitrary number of multipliers within a local structure, such as a DSP Block.

In the respective embodiments of the present invention, with the ripple enable arrangement, portions of the FIR filter can continue to process data while other sections are stalled as each pipeline stage can have a separate enable signal, instead of the same enable signal being used to stall the entire FIR filter. Enable signals can include delays throughout the FIR filter in such a way that correct data values can be stored and used for operation throughout the FIR filter, and the entire filter structure can be started at any point without loss of data.

In a further implementation of the present invention, the disclosed systolic FIR filters with the ripple enable arrangement can be retimed such that adders in the output structure can be re-arranged with no physical elements between the adders, and thus the adders can be merged to save hardware resources.

In another further implementation of the present invention, the disclosed systolic FIR filters with the ripple enable arrangement can be further transformed such that certain enable connections can be removed from some sections of the FIR filter, which improves routing and also reduces power consumption of the circuit.

Figure 1:
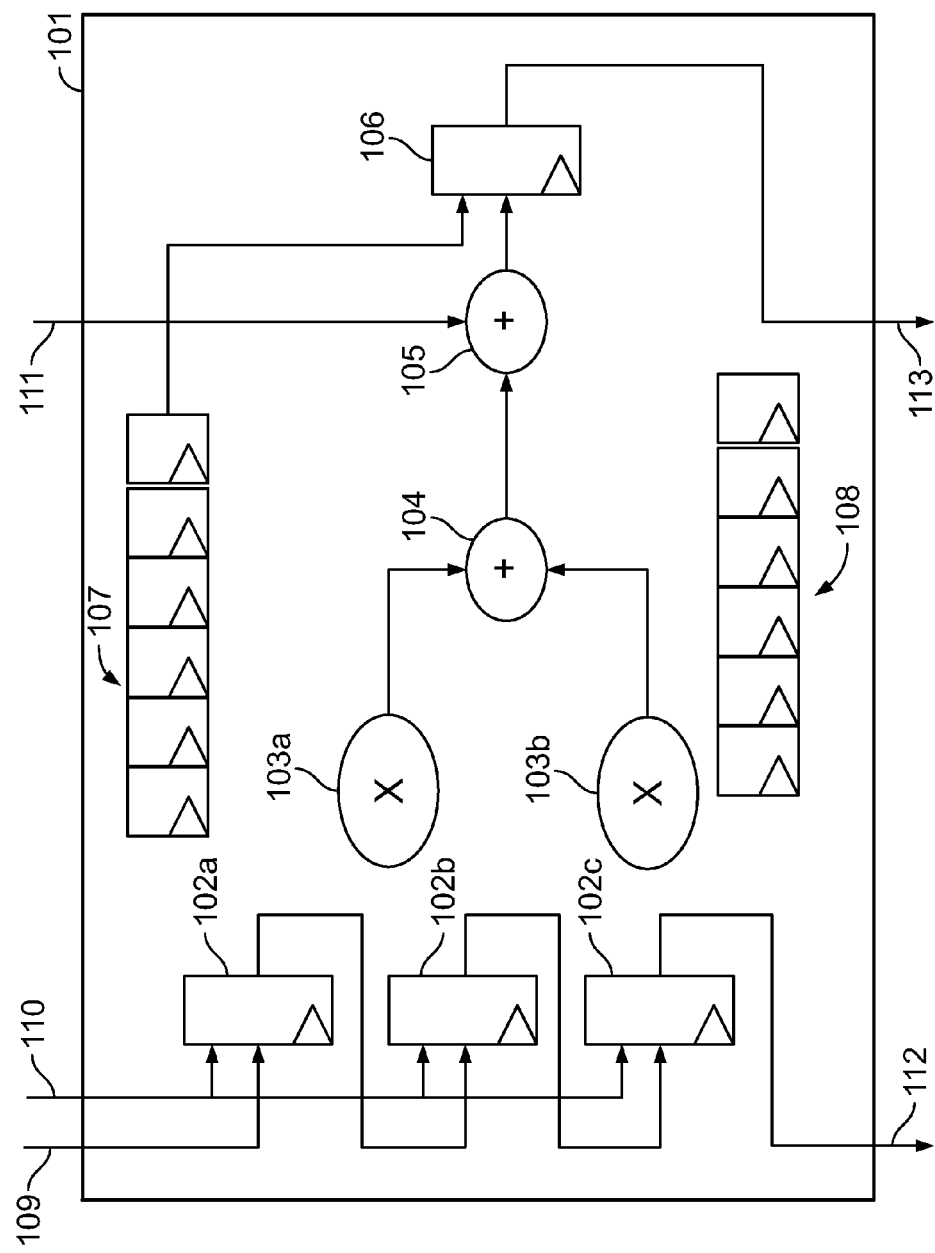
FIG. 1 shows an example circuit diagram of a ripple enable arrangement that is used for a non-systolic filter.

FIG. 1 shows an example circuit diagram of a ripple enable arrangement that is used for a non-systolic filter. The example DSP block 101 shown in FIG. 1 has a data input 109 that is passed on to input registers 102a-c that generate a delayed data signal 112. The filter includes two multipliers 103a-b, which are summed directly at the adder 104 (non-systolic), although this structure can be used in a systolic arrangement of DSP Blocks (not shown in FIG. 1). The sum generated at adder 104 is summed with data input 111 at adder 105. The summed value from adder 105 can then be passed to output register 106 to generate an output 113. Within the DSP block 101, an enable input 110 is delayed from the input stage (e.g., left side of the DSP block 101, including data input line 109 and input registers 102a-c) to the output stage (e.g., right side of the DSP block 101, including the output register 106 and output 113) of this filter by the same latency caused by registers 107 as the pipeline depth of registers 108 of the multipliers 103a-b and adders 104-105. This pipeline depth of registers 108 may be of any value, as long as the latency values of 107 and 108 are the same.

In the respective example in FIG. 1, the configuration of the latency register 107 and the pipeline depth of pipeline registers 108 can allow an arbitrary number of pipeline registers being used or added to the structure. In addition, rather than having the delay registers 107 or pipeline registers 108 being placed to separate adders 104-105, here the two adders 104-105 are directly connected, and thus may be merged to improve hardware efficiency (as further illustrated in FIG. 4).

Figure 2:
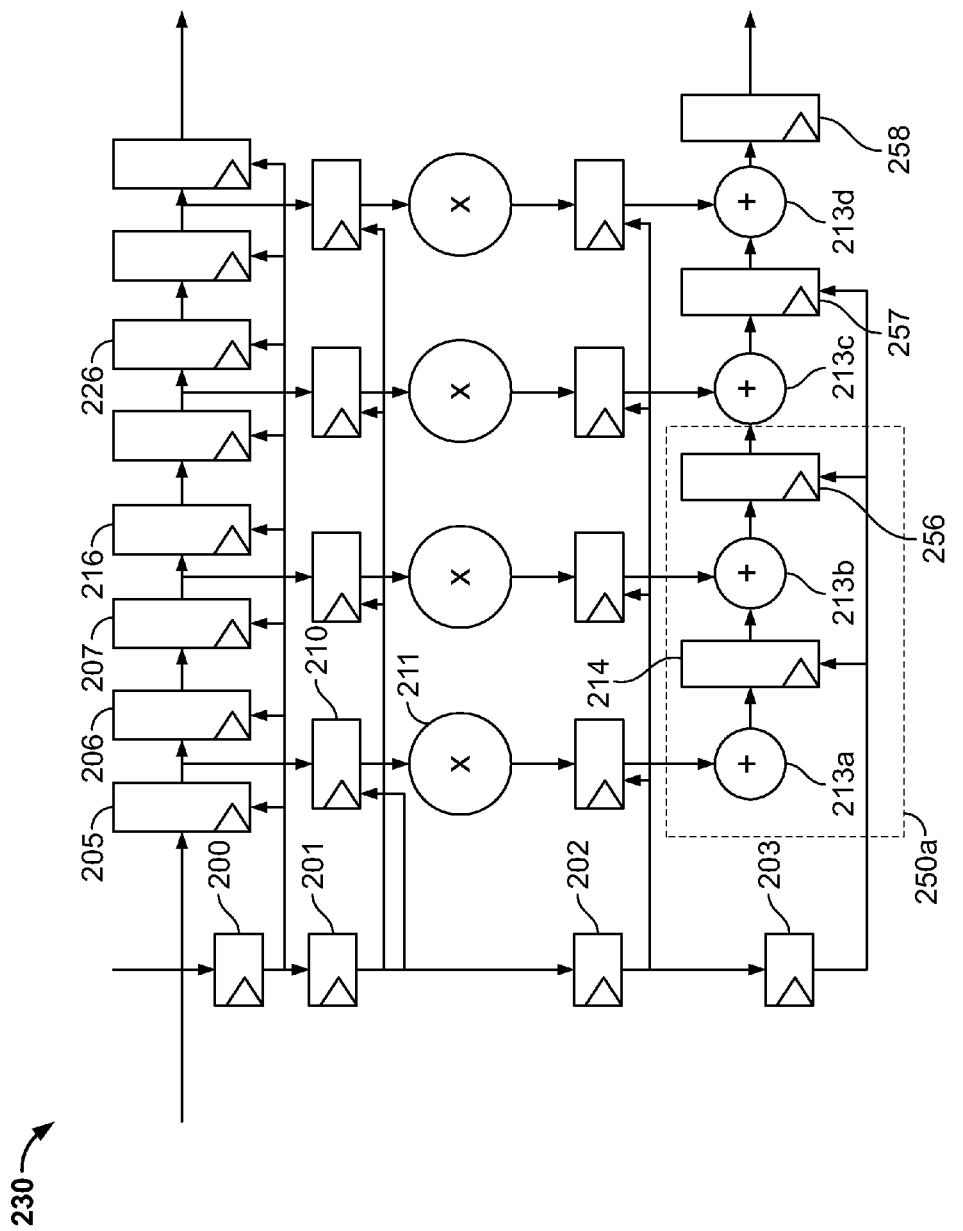
FIG. 2 shows an example logic representation of a systolic filter with a ripple enable.

FIG. 2 shows an example logic representation of a systolic filter with a ripple enable. As shown in FIG. 2, the example systolic filter 230 has a series of input registers 205-207, etc., and each stage of this filter 230 is enabled by a delayed enable signal generated by enable registers 200-203, which break up the fan-out by a factor of 4. Note that the systolic nature of this structure is implemented by the matched registers 206, 214, and the analogous register pairs 216, 256, and 226, 257 that are down the chain, with an output register 258. If these pairs were removed, all the adders 213a-d can be merged with no additional elements between the adders, and the filter 230 would be a Direct Form II FIR. For example, the circuit logic block 250a that contains two adders 213a-b and two registers 214, 256 can be streamlined by re-arranging the registers and thus merging the two adders, as further illustrated in FIGS. 3-4.

Figure 3:
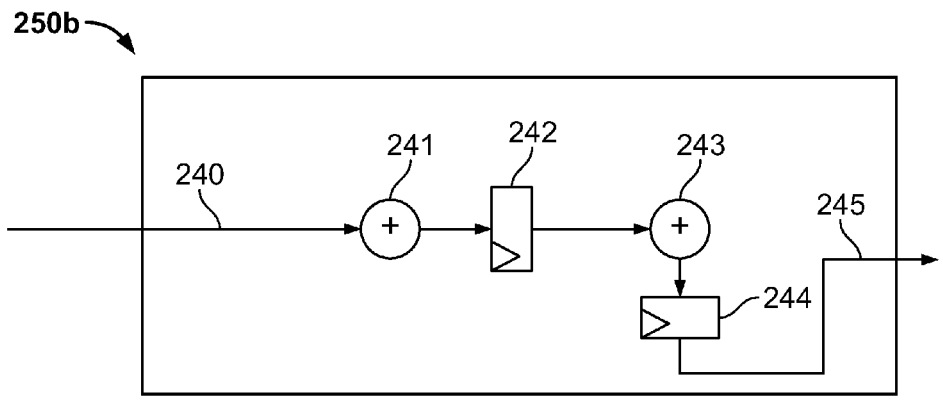
FIGS. 3-4 show example circuit logic diagrams of merging a pair of adders in a systolic FIR output structure.
Figure 4:
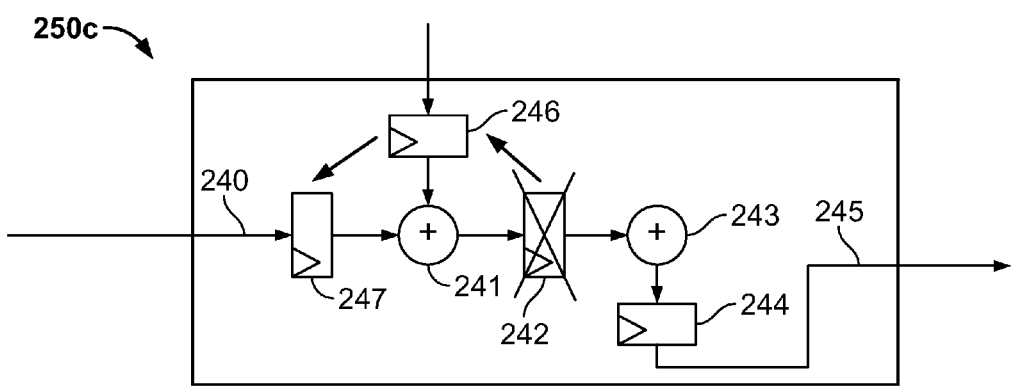

FIGS. 3-4 show example circuit logic diagrams of merging a pair of adders in a systolic FIR output structure. The example circuit block 250b with an input 240 and an output 245 as shown in FIG. 3 can be analogous to the circuit block 250a in FIG. 2, as part of a systolic FIR output structure in a DSP block. Merging the two adders 241, 243 can result in more efficient use of hardware, which can be achieved by retiming the output stage block 250b.

FIG. 4 shows an example of a retimed systolic FIR output structure 250c (transformed from the output structure 250b in FIG. 3) in a DSP block. The register 242 can be moved to the position 246, and a balancing register 247 is added before the adder 241; and the register 244 remains unchanged. In this way, both the total delay through the output structure block 250c, and the single delay between the adders 241, 243, can be preserved to be the same as that of the output structure 250b. It is noted that after the transformation shown in FIG. 4, the single delay between the adders 241, 243 is logical instead of physical, as no other physical element is separating the adders, and the two adders 241, 243 can then be physically merged.

Figure 5:
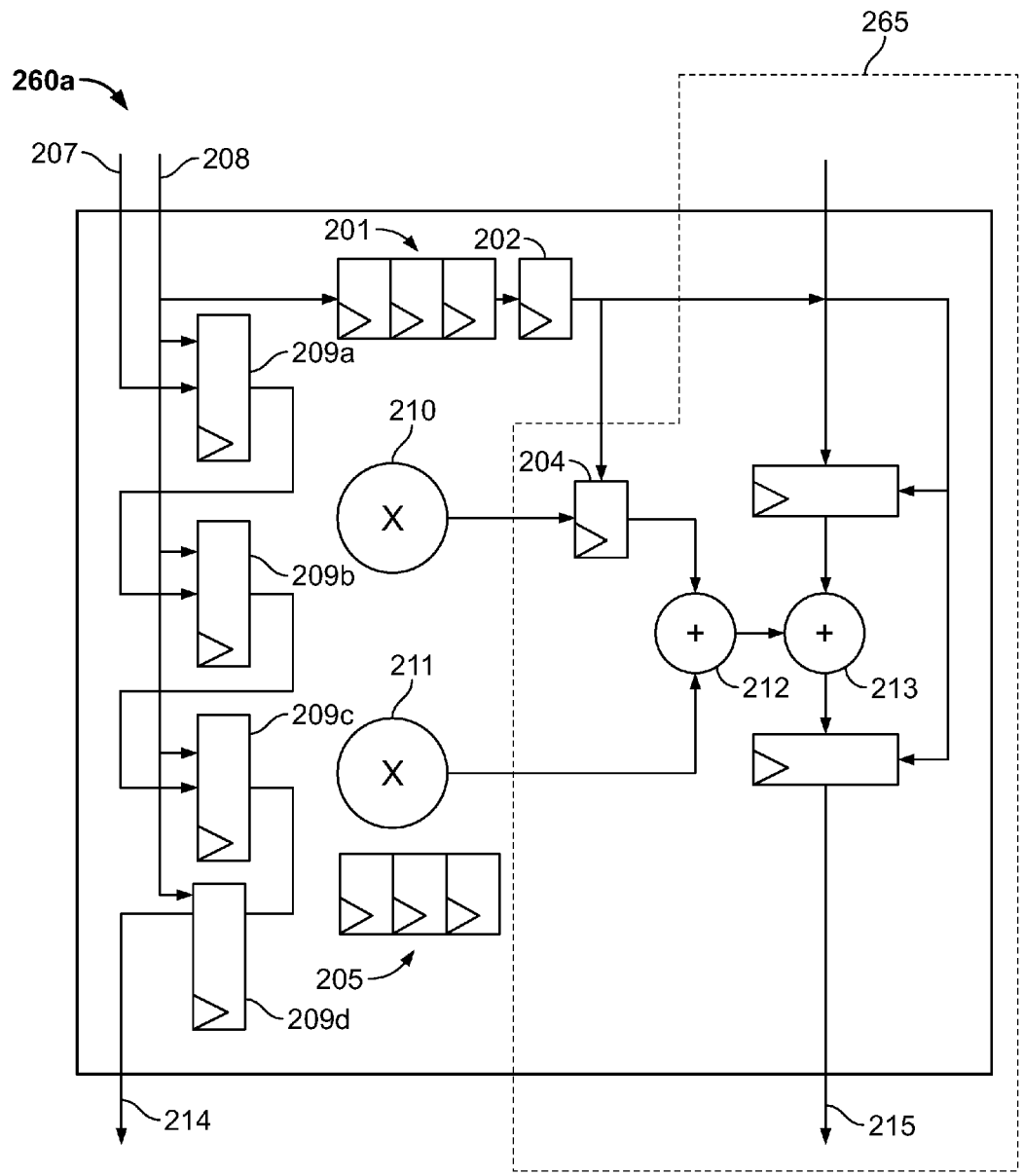
FIG. 5 shows an example circuit diagram of a retimed systolic output structure that includes two multipliers in a DSP block.

FIG. 5 shows an example circuit diagram of a retimed systolic output structure that includes two multipliers 210, 211 in a DSP block 260a. The example DSP block 260a shown in FIG. 5 has a data input 207 that is passed on to filter registers 209a-d to generate a delayed input value 214. Within the DSP block 260a, an enable input 208, which can be analogous to the enable input 110 in FIG. 1, is delayed via delays 201, which is analogous to the delays 107 in FIG. 1. The delay registers 201 can be balanced with the multiplier pipelines 205, e.g., the delay caused by registers 201 is substantially equal to the delay caused by the pipeline registers 205 when the pipeline depth of 205 is equivalent to the delay caused by 201. Register 202 is the delay enable register that is analogous to delay enable register 202 or 203 in FIG. 2.

The output structure 265 of the DSP block 260 has been retimed in a similar manner as illustrated in FIGS. 3-4 such that the pair of adders 212, 213 are not physically separated by any other physical element in between and thus can be physically combined. For example, register 204 has been moved from between the adders 212, 213 to a position that is solely connected to the adder 212, e.g., at a similar position as that of register 246 in FIG. 4. With the systolic register 204, the filter shown within the DSP block 260b does not need to add an additional enable connection for each stage.

Figure 6:
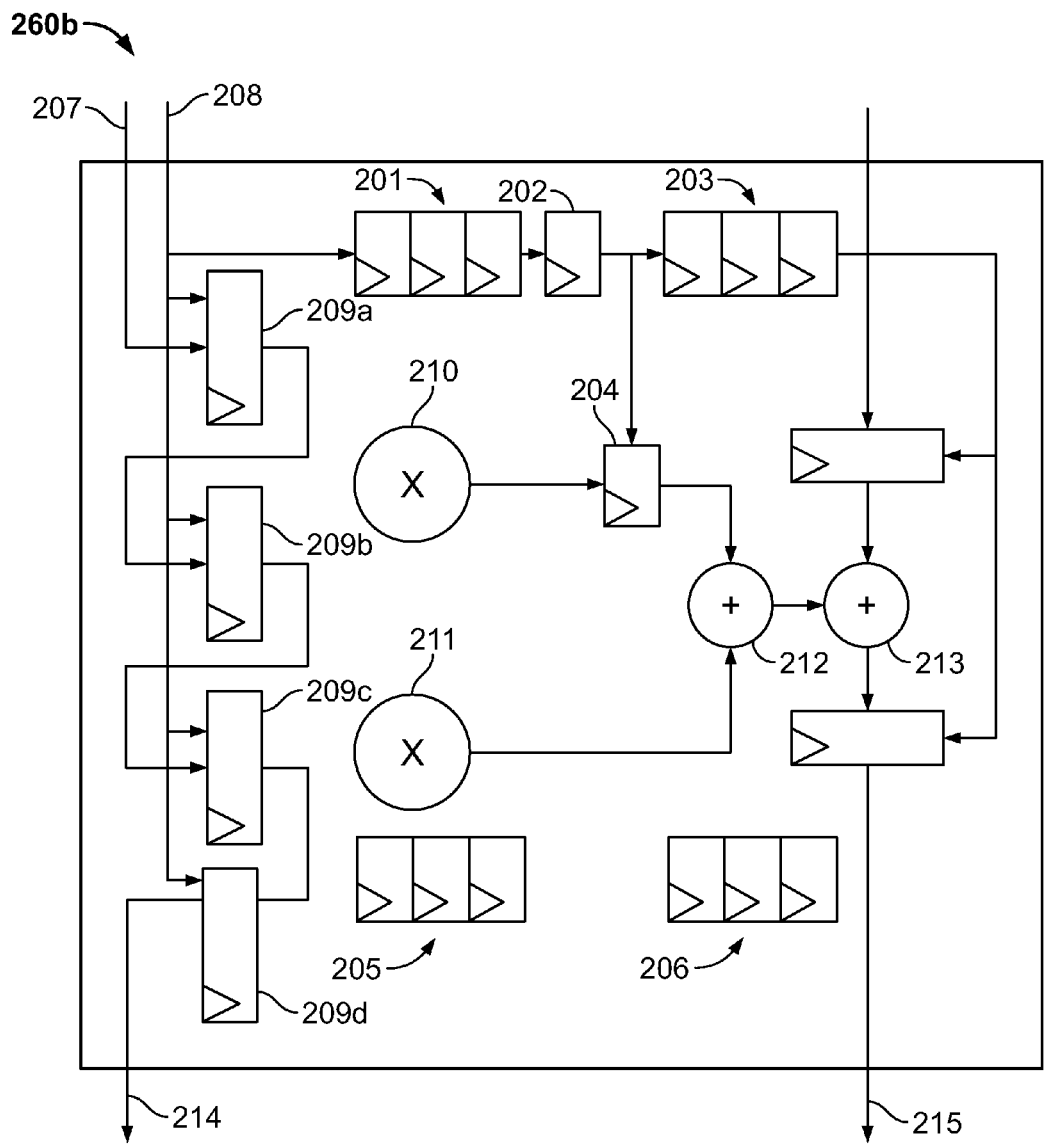
FIG. 6 shows an example circuit diagram of a DSP block with additional level of pipelining in the adder.

FIG. 6 shows an example circuit diagram of a DSP block 260b with additional level of pipelining 206 in the adder 212, 213. With the retimed output structure in the DSP block 260b as developed in FIG. 5, e.g., without any additional register or other physical element separating the pair of adders 212, 213, any level of pipelining 206 can be added in the adder (or any other portion) of the DSP Block 260b. Additional delay enable registers 203 can be added to balance the pipelining 206, e.g., with the depth of the pipelining 206 equivalent to the delay enable registers 203.

In the respective example shown in FIG. 6, the delay enable registers 203 are added within the DSP block 260b. Alternatively, the delay enable registers 203 may be placed outside of the DSP block 260b, e.g., providing an exogenous delay input to the DSP block 260b.

Figure 7:
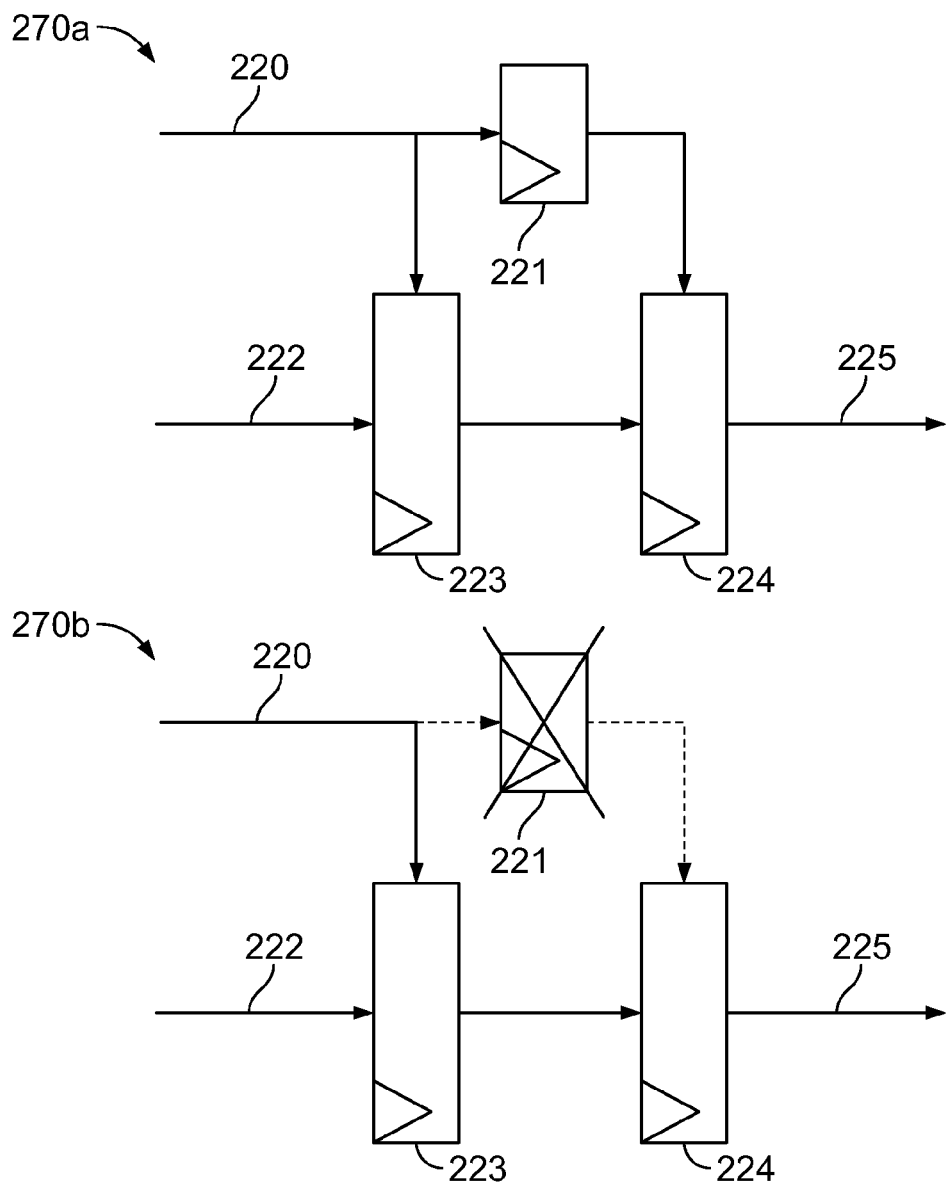
FIG. 7 shows an example circuit diagram of a pipeline enable staging case.

FIG. 7 shows an example circuit diagram of a pipeline enable staging case. The circuit structure 270a has a data input 222 that is passed through two registers 223, 224 to generate a delayed input 225. An enable input 220 is fed to control register 223, and is delayed at enable 221 to generate a delayed enable signal to control register 224. As shown at the circuit structure 270b, the delay enable register 221 between the first register 223 and the second register 224 may not be necessary (e.g., as shown in FIG. 7, register 221 and the enable line to register 224 can be removed from the circuit 270b), because the steady-state operations of the structure 270a having the delay enable register 221 and the structure 270b without the delay enable register 221 are the same. This can be shown, for example, by steady-state analysis, which may be performed in the frequency-domain after Z-transforms of the circuit parameters. It is noted that the operations on reset for the two cases 270a and 270b may be different, but when the circuits 270a and 270b reach their steady state, the circuit characteristics would be the same.

Figure 8:
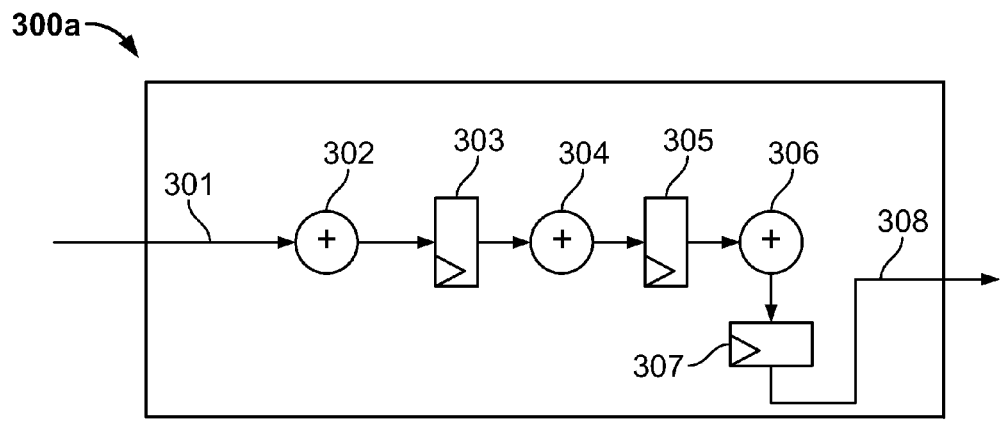
FIGS. 8-10 show a series of example circuit diagrams illustrating transformations of a systolic FIR output structure with an extended group of more than two multipliers in the DSP block, in a similar manner as illustrated in FIGS. 3-4.
Figure 9:
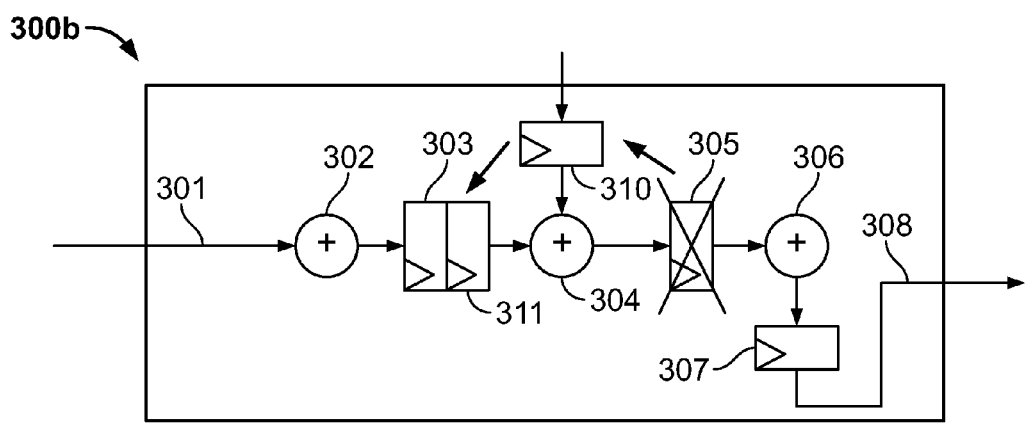
Figure 10:
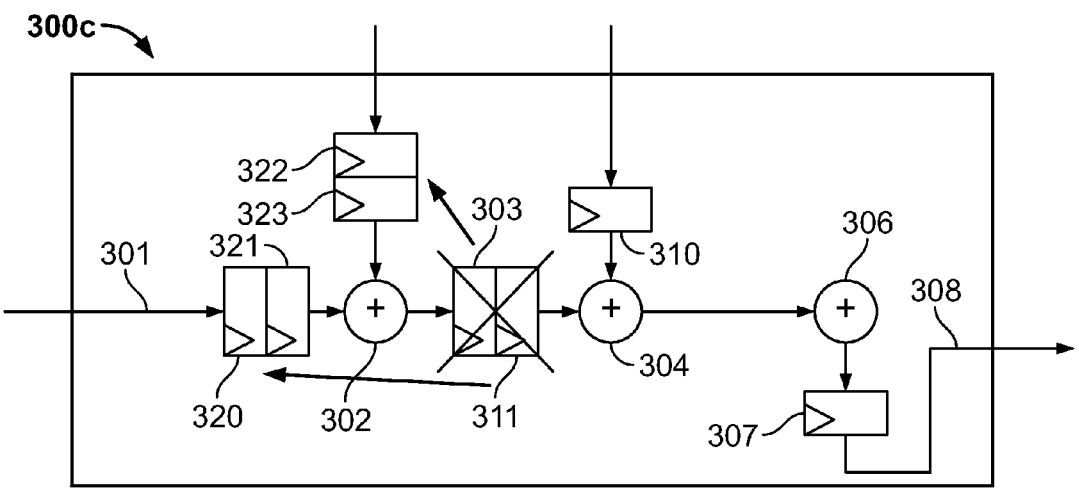

FIGS. 8-10 show a series of example circuit diagrams illustrating transformations of a systolic FIR output structure with an extended group of more than two multipliers in the DSP block, in a similar manner as illustrated in FIGS. 3-4. As shown in FIG. 8, the output structure 300a can be viewed as a chained up version of the block 250b in FIG. 2b, with a data input 301 that is passed through three adders 302, 304, 306, and three registers 303, 305, 307 to generate a data output 308.

As shown in FIG. 9, the output structure 300b is the result of moving one register (e.g., register 305) in the same manner as the transformation shown in FIG. 4. Here, register 305 is moved to the position of register 310, and a balancing register 311 is added before the adder 304 so that the total delay of the output structure 300b (e.g., between the output 308 and the input 301) and the single delay between the adders 304, 306 remain unchanged.

FIG. 10 shows a further transformation of the output structure 300b in FIG. 9, resulting in the output structure 300c. As shown at the output structure 300c, the group of registers 303, 311 can be moved to the position of registers 322, 323, and balancing registers 320-321 are added before the adder 302 to balance registers 322-323. In this way, the original output structure 300a having three adders can be transformed to the output structure 300c that has three adders with no register separating them, and thus the three adders can be merged to save hardware resource.

Figure 11:
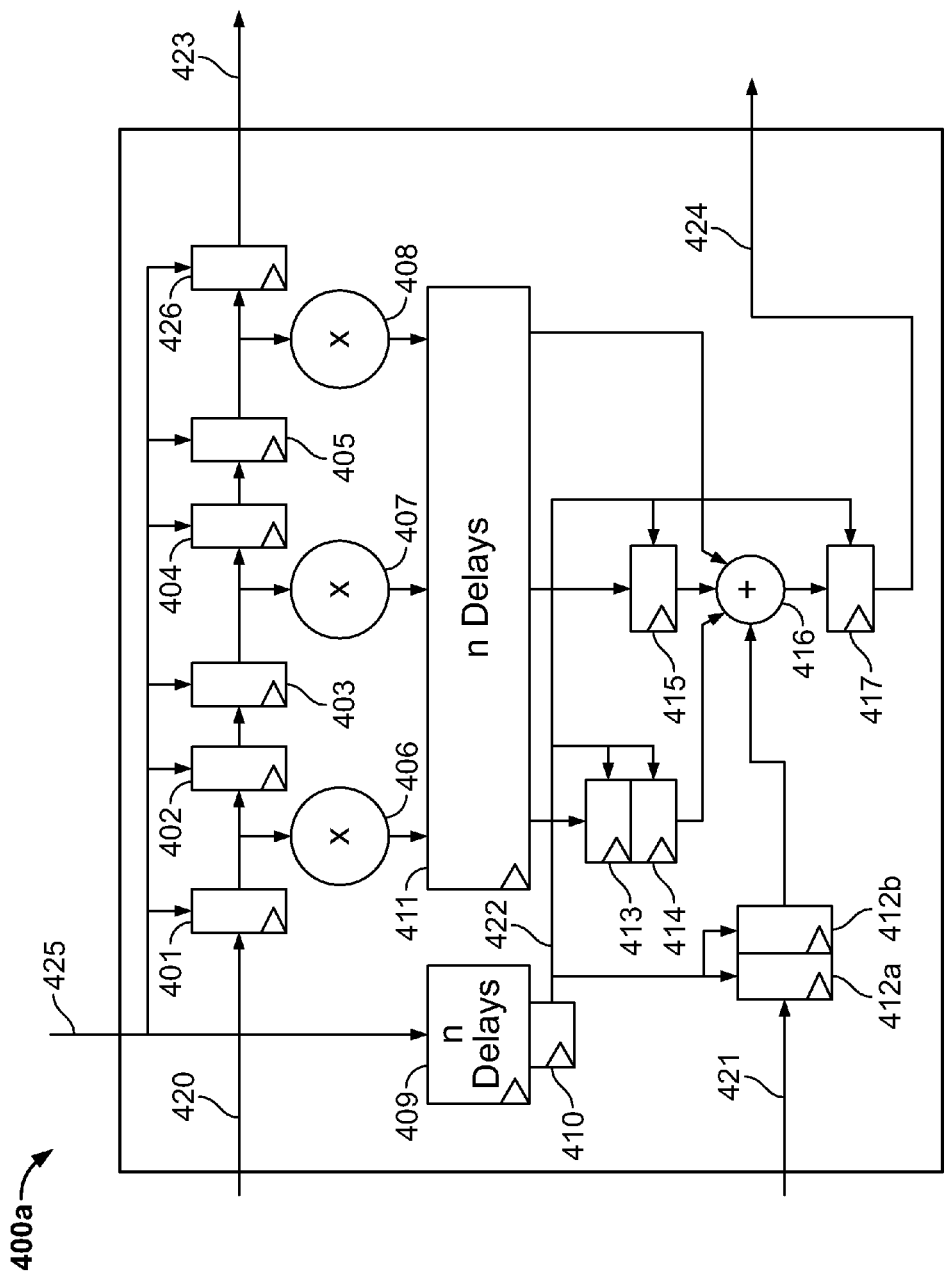
FIGS. 11-14 show a series of example circuit diagrams illustrating transformations of a systolic FIR block that has three multipliers, with similar enable reduction techniques discussed in connection with FIG. 7.

FIGS. 11-14 show a series of example circuit diagrams illustrating transformations of a systolic FIR block that has three multipliers, with similar enable reduction techniques discussed in connection with FIG. 7. As shown in FIG. 11, the systolic FIR block 400a has a data input 420 that is passed through three stages of input registers 401-405, with the delayed input at each delayed stage being passed to a multiplier 406, 407 or 408. The register 426 may generate a delayed input value 423. A group delay block 411 can be added after the three multipliers 406, 407, and 408, with the enables balanced by register 409. The enable input 425 can be delayed at block 409 with the same delay as that in the delay block 411, and then be delayed at enable register 410 to generate the enable signal 422 for systolic registers 413, 414 and 415, and registers 417 and 412a-412b. Data input 421 (delayed by registers 412a-b), the outputs from systolic registers 413, 414 and 415, and the delayed output from multiplier 408 are summed at the adder 416 to generate the filter output 424, after register 417.

In the respective example shown in FIG. 11, the registers in the adder chain (e.g., similar to the block 300a in FIG. 8) have been changed in the three multiplier groups 406, 407, and 408, in a similar manner as illustrated in the transformations illustrated in FIGS. 8-10, resulting in one merged adder 416.

Figure 12:
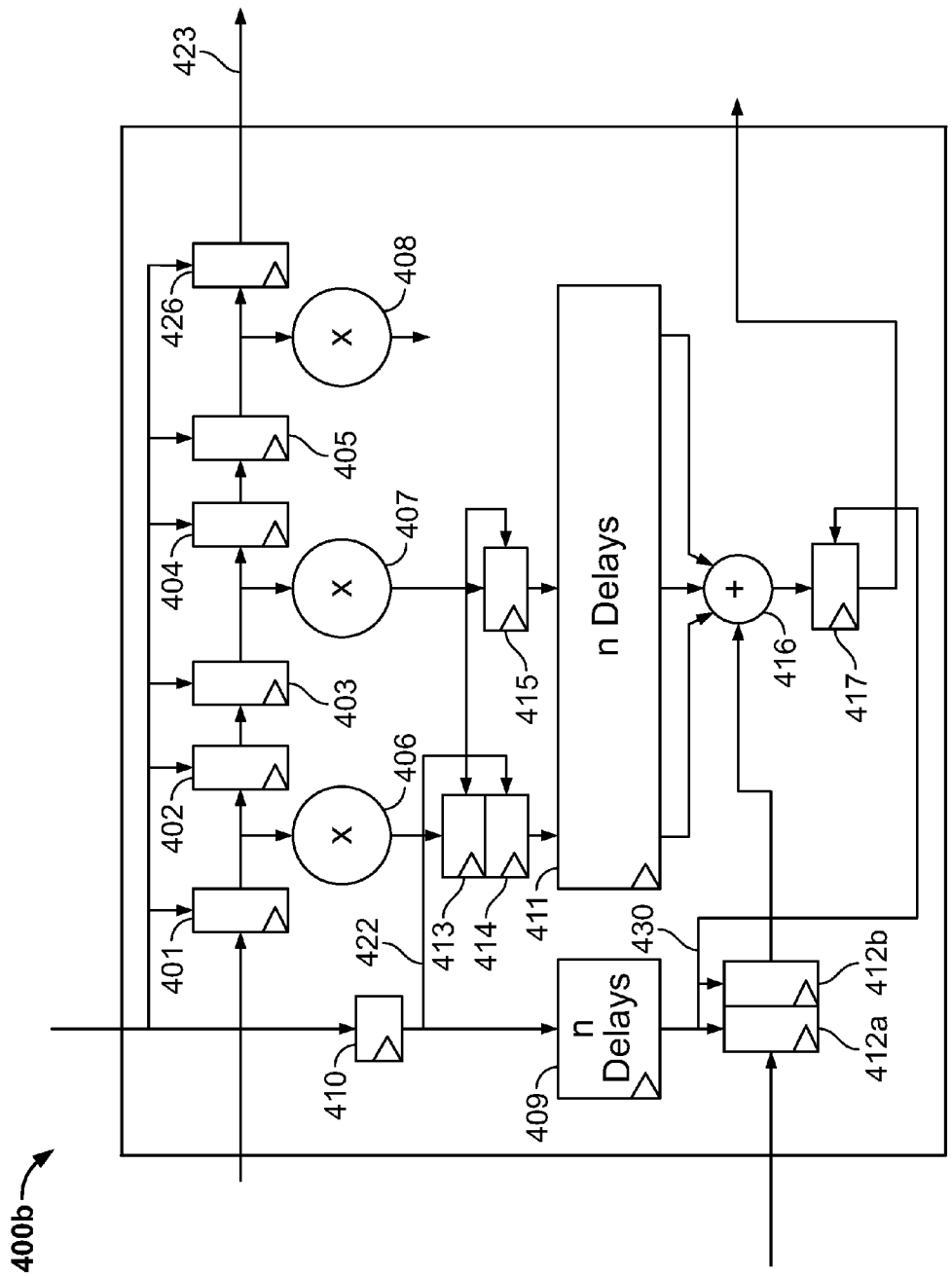
Figure 13:
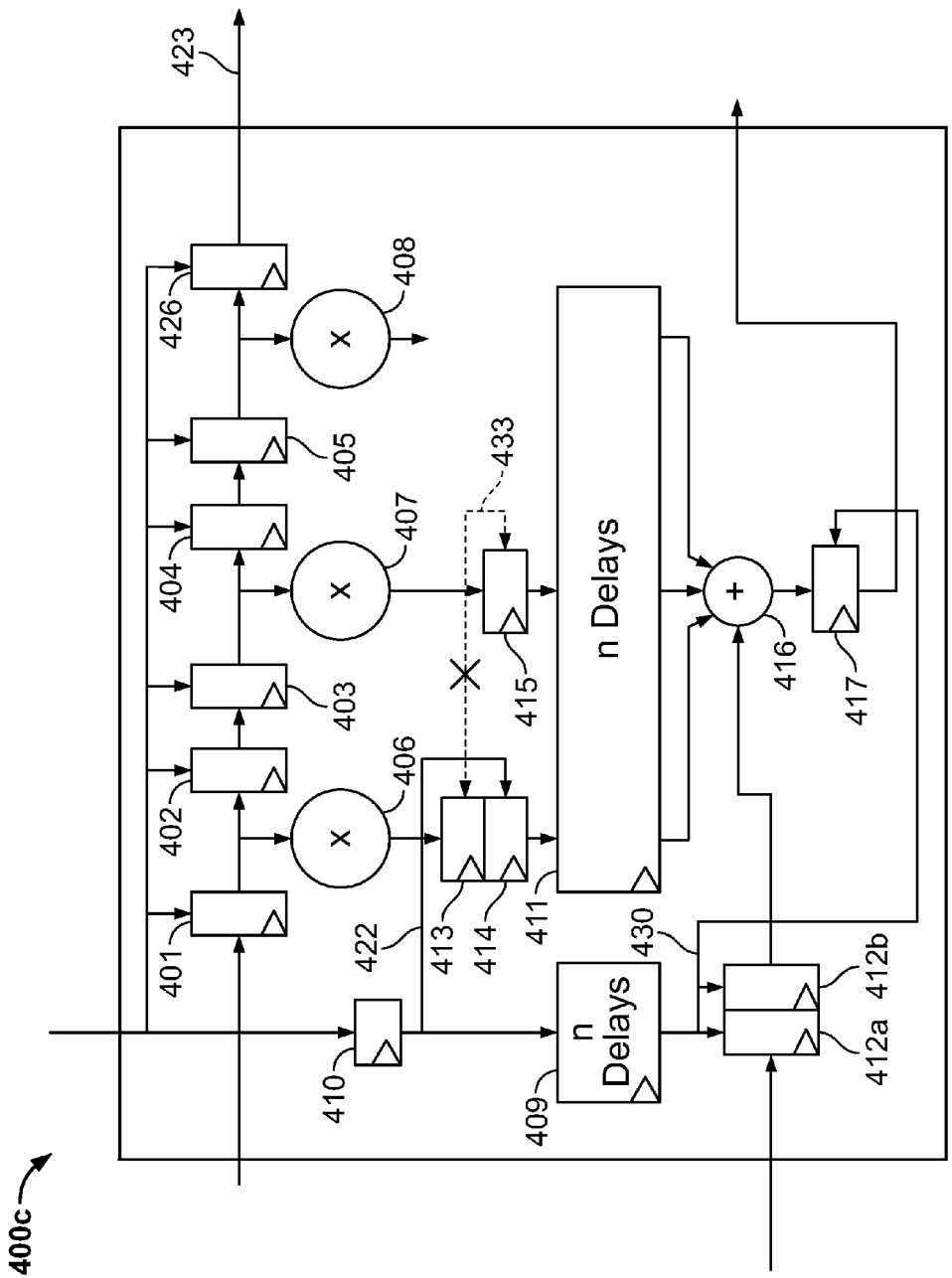

In FIG. 13, the systolic FIR block 400c can have the enable connection 433 removed, as compared with the systolic FIR block 400b in FIG. 12, based on the method illustrated in FIG. 7. For example, as shown at 400b in FIG. 12, the group delay 411, together with the balancing delay 409, can be placed after the systolic registers 413, 414 and 415. An enable signal 430 delayed by register 410 and 409 is generated for the output registers 417 and 412a-b. As shown at block 400c, not all enable connections are required for the systolic registers 413, 414 and 415. Specifically, registers 413 and 415 are thus not enabled. Registers 413 and 415 don't need to be enabled here because based on the transformation illustrated in FIG. 6, registers 413 and 415 can be taken as input registers that are already enabled (e.g., the registers before the multipliers). No enable is needed for the delay block 411 as long as the output enables are delay matched to the whole filter latency.

Figure 14:
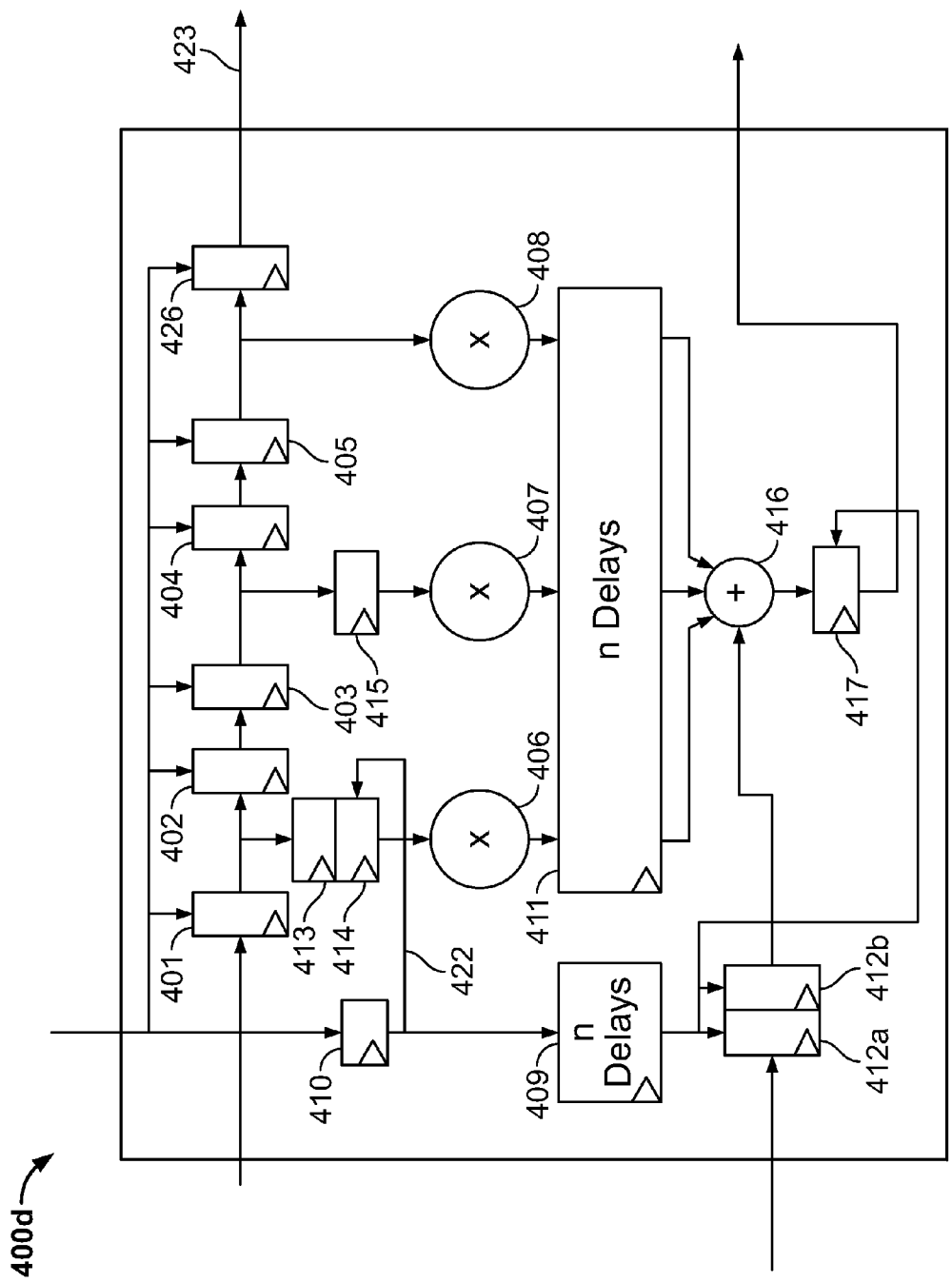

FIG. 14 shows the systolic registers 413, 414 and 415 can be moved to a different position in the systolic FIR block 400d, e.g., before the multipliers 406-407. As shown in FIG. 14, the outputs of registers 401 and 403 are provided to inputs of registers 413 and 415, respectively. In this way, the systolic registers can be grouped with the input registers 401-403, as further illustrated in another FIR filter example in FIGS. 15-16.

FIGS. 15-16 show a series of example circuit diagrams illustrating grouping of systolic registers in a systolic FIR block. As shown in FIG. 15, the block 510a can be the input structure of a 4-stage systolic FIR filter, which can be an expansion of the 3-stage systolic filter block 400d in FIG. 14. This type of structure can be further expanded for any size of systolic filter grouped together. An enable input 500 is fed into the enable register 501, and each of the systolic registers 502-507.

As shown in FIG. 16, in a similar manner as discussed in FIG. 7, the first register (e.g., register 502, 505 and 507) of the systolic delay for each multiplier does not have to be connected to the enable input 500, and thus further routing resources and power can be saved.

Figure 17:
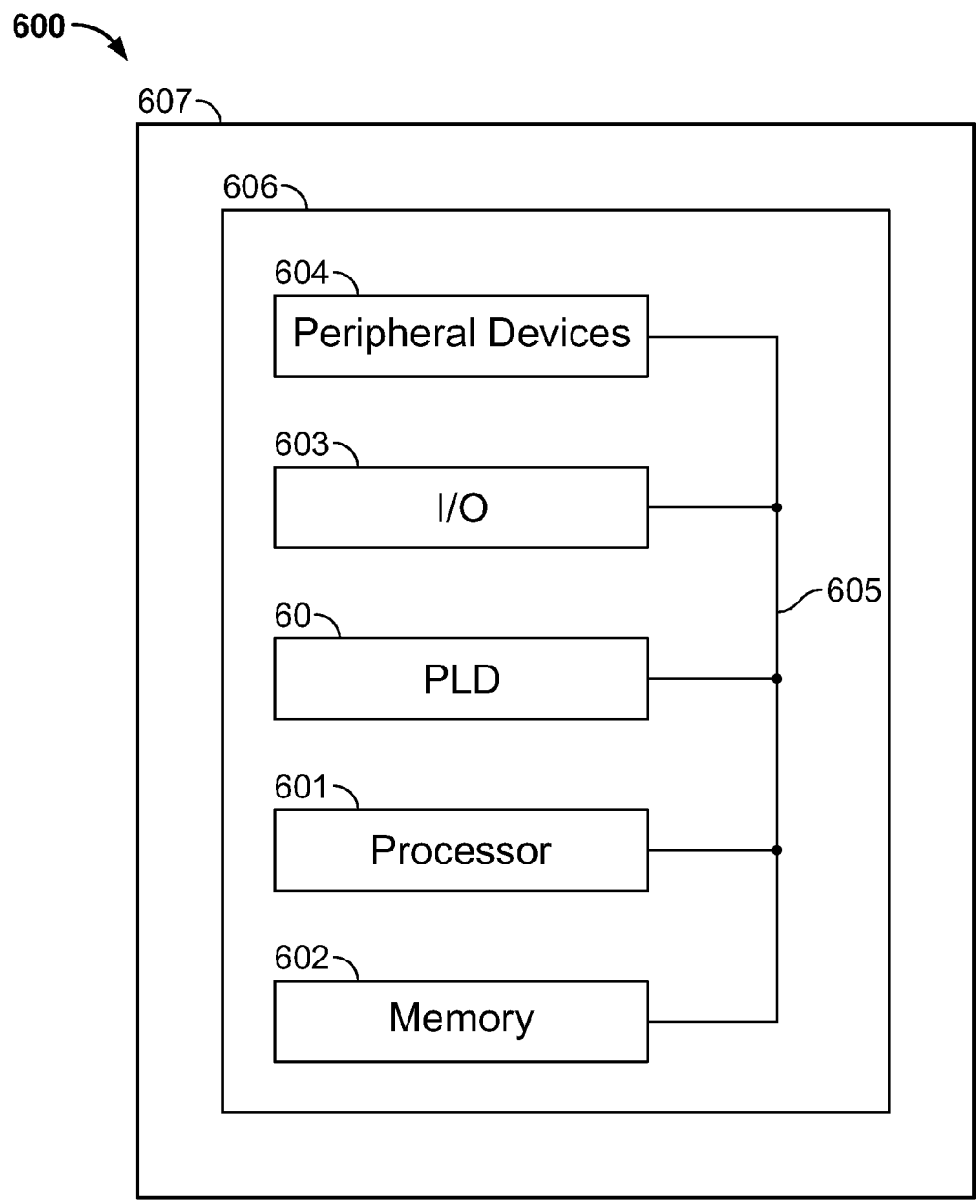
FIG. 17 is a simplified block diagram of an exemplary system employing a programmable logic device incorporating the present invention.

FIG. 17 is a simplified block diagram of an exemplary system employing a programmable logic device incorporating the present invention. A PLD 60 configured to include arithmetic circuitry according to any implementation of the present invention may be used in many kinds of electronic devices. One possible use is in an exemplary data processing system 600 shown in FIG. 17. Data processing system 600 may include one or more of the following components: a processor 601; memory 602; I/O circuitry 603; and peripheral devices 604. These components are coupled together by a system bus 605 and are populated on a circuit board 606 which is contained in an end-user system 607.

System 600 can be used in a wide variety of applications, such as computer networking, data networking, instrumentation, video processing, digital signal processing, Remote Radio Head (RRH), or any other application where the advantage of using programmable or reprogrammable logic is desirable. PLD 60 can be used to perform a variety of different logic functions. For example, PLD 60 can be configured as a processor or controller that works in cooperation with processor 601. PLD 60 may also be used as an arbiter for arbitrating access to shared resources in system 600. In yet another example, PLD 60 can be configured as an interface between processor 1801 and one of the other components in system 600. It should be noted that system 600 is only exemplary, and that the true scope and spirit of the invention should be indicated by the following claims.

Various technologies can be used to implement PLDs 60 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. Circuitry accepting a data input and an enable input and generating an output based on the data input, the circuitry comprising:
   an input stage circuit including:
      an input register accepting the enable input;
      an enable register configured to accept the enable input and generate a delayed enable signal for flow control of the circuitry;
   an intermediate stage circuit that is coupled to the input stage circuit including:
      a first systolic register that is operated without any enable connection at the steady state of the circuitry,
      a second systolic register sequentially connected to the first systolic register, wherein the second systolic register is connected to the enable register to accept the delayed enable signal, and
      a multiplier connected in series with the first and second systolic registers, wherein the multiplier is configured to generate a product value; and
   an output stage circuit that is coupled to the intermediate stage circuit and includes an adder that calculates the output based at least in part on the product value.

2. The circuitry of claim 1, wherein the multiplier is placed between the input stage circuit and the first systolic register.

3. The circuitry of claim 1, wherein the multiplier is placed between the second systolic register and the output stage circuit.

4. The circuitry of claim 1, further comprising a group delay register placed between the intermediate stage circuit and the output stage circuit,
   wherein the group delay register is operated without any enable connection.

5. The circuitry of claim 4, further comprising a balancing delay register to delay the enable input to balance the group delay register.

6. The circuitry of claim 5, wherein the group delay register is connected to the adder in the output stage circuit, and the balancing delay register is connected to an output register in the output stage circuit.

7. Circuitry accepting a data input and an enable input and generating a finite impulse response output based on the data input, the circuitry comprising:
   an input stage circuit including an input register;
   an enable register that receives the enable input and generates a delayed enable signal;
   an intermediate stage circuit that is coupled to the input stage circuit including:
      first and second systolic registers that are operated without any enable connection at the steady state of the circuitry,
      a third systolic register sequentially connected to the first systolic register, wherein the third systolic register is connected to the enable register to accept the delayed enable signal,
      a first multiplier connected in series with the first and third systolic registers;
   a second multiplier connected in series with the second systolic register; and
   an output stage circuit operatively connected to the intermediate stage circuit, including:
      an adder circuit including a single adder, or a pair of adders without any physical element separating the pair of adders.

8. The circuitry of claim 7, wherein the input register is enabled by an enable input.

9. The circuitry of claim 7, further comprising a plurality of pipelines coupled between the intermediate stage circuit and the output stage circuit.

10. The circuitry of claim 9, further comprising:
    an output register in the output stage circuit that is coupled to the adder circuit; and
    a delay register connected to the enable register, wherein:
    the delay register creates a delayed enable signal to balance the plurality of the pipelines; and
    the output register accepts the delayed enable signal.

11. The circuitry of claim 7, further comprising:
    a plurality of pipelines to pipeline operations of the adder circuit.

12. The circuitry of claim 11, further comprising a delay register connected to the output stage circuit and the enable register, wherein
    the delay register creates a delayed enable signal to balance the plurality of the pipelines.

13. The circuitry of claim 11, wherein the output stage circuit receives an exogenous delay input to balance the plurality of pipelines.

14. The circuitry of claim 7, further comprising:
    a plurality of pipelines disposed with a physical element within the circuitry to pipeline an operation of the physical element, wherein
    the physical element is different from any of the first multiplier, the second multiplier, the adder circuit; and
    a delay register to balance the plurality of pipelines.

15. The circuitry of claim 7, wherein the single adder calculates an output sum based at least in part on product values calculated by the first multiplier and the second multiplier, and a value of the data input without any additional adder.

16. A pipelined systolic finite impulse response (FIR) filter, comprising:
    an input stage circuit including an input register, wherein the input register accepts an enable input;

an enable delay register that accepts the enable input and generates a delayed enable signal;

a FIR calculation circuit that is coupled to the input stage circuit, including:
- a first systolic register that is operated without any enable connection at the steady state of the circuitry,
- a second systolic register sequentially connected to the first systolic register, wherein the second systolic register is connected to the enable delay register to accept the delayed enable signal, and
- a multiplier connected in series with the first and second systolic registers;

an output stage circuit, including an adder that calculates an output sum; and a plurality of pipeline registers to pipeline part of an operation of the FIR calculation circuit or the adder, wherein each pipeline stage of the pipelined systolic FIR filter has a separate enable register without fanning out the enable input for each pipeline stage.

17. The circuitry of claim 16, further comprising a plurality of delay registers being disposed between the input stage circuit and the output stage circuit,
wherein the plurality of delay registers creates a latency in the enable input equivalent to a depth of the plurality of pipelines.

18. The circuitry of claim 16, wherein the separate enable register at each pipeline stage generates a delayed enable signal to enable a respective pipeline stage.

19. The circuitry of claim 16, wherein the multiplier is placed between the input register and the first systolic register.

20. The circuitry of claim 16, wherein the output stage circuit is retimed by a retiming register to operate without any additional adder other than the adder.

21. A method for operating a pipelined systolic finite impulse response (FIR) filter, comprising:

receiving, at an input register, a data input signal and an enable input signal, wherein
the input register generates a delayed data input signal;

receiving, at an enable register, the enable input signal, wherein the enable register generates a delayed enable signal;

transmitting the delayed data input signal to a first systolic register operatively connected to the input register, wherein
the first systolic register is operated without any enable connection;

transmitting a first systolic register output from the first systolic register to a second systolic register, wherein the second systolic register accepts the delayed enable signal from the enable register;

calculating, at a multiplier, a product value based at least in part on a second systolic register output from the second systolic register; and generating, at an adder, an output sum based least in part on the product value.

22. The method of claim 21, further comprising:
pipelining, via a plurality of pipeline registers disposed in connection with the multiplier or the adder, an operation of the multiplier or the adder.

* * * * *